United States Patent
Graves

(10) Patent No.: US 6,268,759 B1
(45) Date of Patent: Jul. 31, 2001

(54) LOW-POWER 5-VOLT INPUT/OUTPUT TOLERANT CIRCUIT WITH POWER-DOWN CONTROL FOR A LOW VOLTAGE CMOS CROSSBAR SWITCH

(75) Inventor: Christopher Michael Graves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,928

(22) Filed: Nov. 23, 1999

(51) Int. Cl.[7] ............................................... H03K 17/687
(52) U.S. Cl. ........................ 327/437; 327/319; 327/333; 326/21; 326/81
(58) Field of Search ..................................... 327/309, 318, 327/333, 319, 332, 427, 437; 326/21, 68, 81, 83, 86

(56) References Cited

U.S. PATENT DOCUMENTS

| | | | |
|---|---|---|---|
| 4,634,890 | * 1/1987 | Lee | 327/319 |
| 5,475,332 | * 12/1995 | Ishimoto | 327/427 |
| 5,570,061 | * 10/1996 | Shimoda | 327/545 |
| 6,064,228 | * 5/2000 | Sichert et al. | 326/68 |
| 6,100,719 | * 8/2000 | Graves et al. | 326/21 |
| 6,150,844 | * 11/2000 | Campardo et al. | 326/81 |

* cited by examiner

Primary Examiner—Terry D. Cunningham
Assistant Examiner—An T. Luu
(74) Attorney, Agent, or Firm—Pedro P. Hernandez; W. James Brady, III; Frederick J. Telecky, Jr.

(57) ABSTRACT

A low voltage CMOS bus switch (20) adapted to connect to a 5V bus (A,B) in a controlled and power-efficient manner. A voltage reference circuit (30) monitors the state of the power supply (Vcc) and provides three control signals (Dref, Dref2, Dref3) when the supply ($V_{cc}$) is powered up or down. These control signals help to keep the switch open when the supply is powered down, and are used in the 5V tolerant circuitry to bias the gates of the pass transistors (MN1,MP1) when the supply is powered up. When the bus voltages are below Vcc, the device operates as a normal low voltage bus switch. As the input voltage increases above Vcc, a P-channel pass transistor (MR1) turns off and a gate voltage of a N-channel pass transistor (MN1) is controlled by the tolerant circuitry. This provides a reliable output signal to either a 3.3V or 5V bus.

23 Claims, 3 Drawing Sheets

US 6,268,759 B1

LOW-POWER 5-VOLT INPUT/OUTPUT TOLERANT CIRCUIT WITH POWER-DOWN CONTROL FOR A LOW VOLTAGE CMOS CROSSBAR SWITCH

FIELD OF THE INVENTION

This invention is generally related to bus switches, and more particularly to CMOS crossbar switches.

BACKGROUND OF THE INVENTION

The digital electronics industry is migrating to lower operating voltages, but systems are performing at increasing speeds. High-speed bus switches are needed in these systems to keep the data moving fast. Hence, crossbar switches that operate at lower voltages will be required in future systems while still being able to connect to the high voltage buses. There is desired a way to interface a 5V bus with a 3.3V bus, using a high-speed bus switch that operates with a 3.3V power supply. In addition, there is desired control circuitry that does not consume much power and controls the device behavior during a power-sequencing event. This would eliminate the need for special power-sequencing circuitry in the system design which results in a less expensive system.

A basic low voltage CMOS crossbar switch is shown as circuit 10 in FIG. 1. This circuit 10 is typical of the input/output configuration of a low voltage bus switch which is a N-channel pass transistor MN1 in parallel with a P-channel pass transistor MP1. The gates of the pass transistors are driven by complementary signals generated by the output enable circuit signal OE. Thus, the switch 10 will be closed when the gate voltage of transistor MN1 is high and the gate voltage of transistor MP1 is low. Likewise, the bus switch 10 will be open when the gate voltage of transistor MN1 is low and the gate voltage of transistor MP1 is high. Since both pass transistors will be turned on when the switch 10 is enabled, the output voltage at node B will match the input voltage at node A without a voltage drop across the switch 10. Also, transistors MP3 and MP4 are a part of a power-down control circuit that will keep the bus switch 10 open during a power-sequencing event.

A problem with this prior art implementation occurs when one of the I/O ports (A or B) is connected to a 5V bus. The Dref signal that controls blocking transistors MP3 and MP4 will be approximately equal to Vcc or 3.3V in this case. If the bus switch is enabled, then transistor MN2 is on which pulls the gate of transistor MP1 low. However, if one of the I/O ports is connected to a 5V bus that is high, then the corresponding blocking transistor, MP3 or MP4, will turn on because its source voltage is a Vtp higher than its gate voltage. This creates a leakage path from the 5V bus through the blocking transistor and MN2 to ground which causes the device to no longer function properly.

The crossbar switch shown in FIG. 1 would still have a problem connecting to a 5V bus even if the leakage path to ground could be blocked. The transmission gate implementation of the low voltage bus switch would allow a high voltage on the 5V bus to be directly connected to the 3.3V bus which may or may not be 5V input tolerant. Therefore, there must be some voltage level translation in any bus switch that connects a 5V bus and a 3.3V bus. This could be accomplished with the use of a charge pump and a N-channel pass transistor. The problem with the charge pump solution is that the power supply current (Icc) is much higher which is very undesirable for notebook applications.

SUMMARY OF THE INVENTION

The present invention achieves technical advantages as a low-power 5-volt input/output tolerant CMOS crossbar switch having unique control circuitry. The control circuitry allows the CMOS crossbar switch to use only a 3.3 volt power supply, which is advantageous in notebook applications.

The present invention provides a basic low voltage bus switch with the control circuitry controlling the gate of an N-channel pass transistor to make the input/output ports 5Volt tolerant. The switch acts like a conventional crossbar low voltage device when both I/O ports are below 3.3 volts, but as soon as one of the I/O ports increase beyond 3.3 volts, a P-channel pass transistor turns off to limit the high voltage on the output. The control circuitry uses the I/O voltage for controlling the gate voltage of the N-channel pass transistor and to keep the crossbar switch off when the device is powered down.

The present invention achieves technical advantages as a low power consumption circuit and which occupies less wafer chip space. The present invention doesn't use a charge pump or require an oscillator.

DETAILED DESCRIPTION OF PREFERRED EMBODIMENTS

Output Circuit

Figure 1:
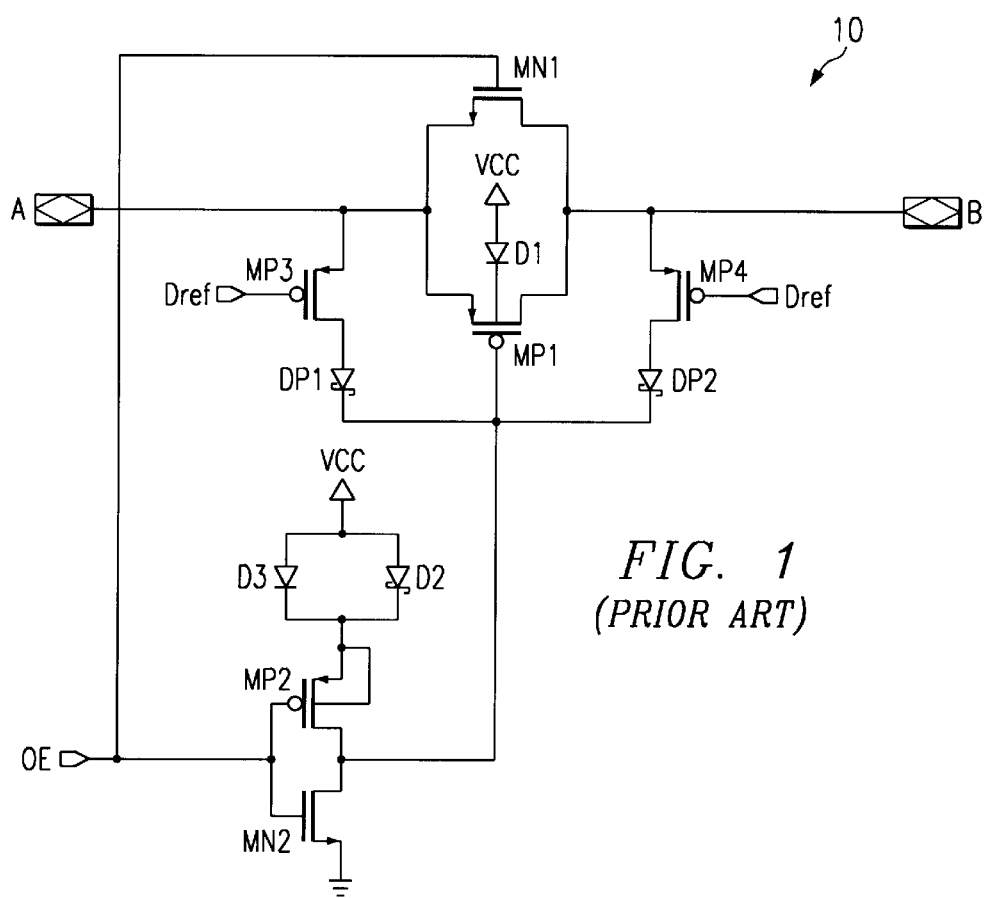
FIG. 1 is a schematic diagram of a basic prior art low voltage CMOS crossbar switch.

An output circuit 20 that solves the 5V tolerant problem described previously is shown in FIG. 2. This circuit 20 has the basic low voltage crossbar switch 10 with additional control circuitry for the N-channel pass transistor MN and for blocking the leakage current path from the I/O ports A and B to ground. In the proceeding discussion, the A port will be assumed to be connected to a 5V bus and the B port willN1 be assumed to be connected to a 3.3V bus. The switch output enable signals, In1 and In2, are complementary signals where In2 is driven by an inverter that is one stage ahead of the In1 signal driver.

When the power supply is on (Vcc=3.3V), the control signal, Dref, is approximately 1V below Vcc and biases blocking transistors MP3 and MP4 off when both I/O ports are low. The voltage level of signal Dref3 is about 1.5V and biases transistors MN11, MN12, MNT1, and MNT2 on to provide a weak puldown for transistors MPN1, MPN2, MPT2 and MPT4, respectively. If signal In2 is in a low state (signal In1 is high), then transistor MP2 will be on which pulls node S4 high and turns off pass transistor MP1 . At the same time, transistor MN7 will be on which pulls node S2 low and biases off pass transistor MN1 so that the bus switch is open. In order for the switch to be closed, control signal In2 will be high and In1 will be low. This turns on MN2 and pulls node S4 low because transistors MPN1 and MPN2 are biased on by the weak pulldown transistors MN11 and transistor MN12, respectively. Likewise, signal line turns on transistor MP8 which pulls node S2 high and biases on pass transistor MN1.

This bus switch implementation works in the same manner for bus voltages up to Vcc on either port A or B. For bus voltages above Vcc there are two distinct phases where the control circuitry biases the gates of the pass transistors. Depending on the power supply voltage, temperature, and material strength the Dref signal will range from 2V to 2.6V for a 3.3V (+/−10%) power supply. Since the threshold voltage of the P-channel transistors is approximately 1V, blocking transistor MP3 or MP4 will turn on if either port A or B reaches a Vtp above the Dref signal which is nearly equivalent to Vcc. When the blocking transistor turns on, the corresponding node S7 or S8 will be pulled high to the bus voltage and will bias off transistor MPN1 or MPN2, respectively. The high bus voltage will also be connected to the gate of pass transistor MP1 through a Schottky diode DP1 or DP2 and will turn transistor MP1 off since the forward drop of the diode is less than the Vtp. The voltage on node S4 will stay high because transistor MPN1 or MPN2 blocks the leakage path from the bus to ground. Hence, the P-channel pass transistor MP1 will remain off, regardless of the output enable signal, for any voltage above Vcc on the I/O ports.

At the same time, the gate voltage of pass transistor MN1 will be controlled by the preferred embodiment circuitry of the present invention. The voltage reference signal Dref2 is set to a Schottky diode drop (−0.3V) below Vcc so transistors MPT1 and MPT3 are biased off when the bus voltage is just above Vcc. This causes nodes S16 and S20 to be pulled low by weak transistors MNT1 and MNT2, respectively. Therefore, transistors MPT2 and MPT4 will be on to allow node S12 to be pulled high to a voltage equal to the highest voltage on either port A or B minus a Schottky diode forward drop (D12 or D13). The gate voltage of pass transistor MN1 will be determined by the output enable control signal In1. If In1 is high, then MN7 will be on and pull the gate of transistor MP6 to ground, which turns it on. This allows the high bus voltage found at node S12 to connect to node S11 and make sure that the Vgs of transistor MP7 is 0V to keep it turned off. This ensures that node S2 will remain low and that the crossbar switch will be open. If In1 is low, then MN6 will be on and pull the gate of transistor MP7 to ground, which turns it on. This couples the high bus voltage on node S12 directly to the gate of pass transistor MN1. This is very important because the worst-case drop across the N-channel transistor is greater than 1V due to to the Vtn and body effect. A gate voltage of only 3V (lowest Vcc value) on transistor MN1 produces an output voltage of less than 2V which is the minimum Vih value required for a 5V or 3.3V device. Advantageously, by coupling the high bus voltage to the gate of the N-channel pass transistor, the minimum output voltage will be above 2V.

The second phase of the present invention, where the 5V tolerant circuitry biases the gates of the pass transistors, comes into play because the output voltage should not be allowed to go higher than 3.6V. In this example, the B port is connected to the 3.3V bus along with several other device inputs. These devices may or may not be 5V input tolerant, so the maximum voltage on the bus should be limited to 3.6V to prevent damage and reliability problems. Since the gate of transistor MN1 could be coupled to 5.5V (from the A port), the output voltage on the B port could go as high as 4.5V if there were no additional control circuitry. According to the present invention, when the voltage on the A port increases to a Vtp above Vcc, transistor MPT1 will turn on and pull node S16 to the high bus voltage minus a Schottky diode drop. This will turn off transistor MPT2 and force the current to go down the path with the two PN diodes, D9A and D9B, in series. This could also be embodied as a diode connected transistor and a Schottky diode in series to further limit leakage current. This creates a larger voltage drop from the 5V bus to node S12 in order to keep the gate voltage of transistor MN1 from getting too high. Thus, a 5.5V signal on the A port results in approximately a 4.5V signal at node S2 and the B output is limited to a voltage level of about 3.5V.

Now, considering the case when the device is powered down, since the gate of the N-channel pass transistor could be coupled to a high voltage from one of the buses, the switch could be closed during power down and would not isolate the buses. During normal operation, transistor MNVOFF is biased on and pulls node S10 to ground in order to keep transistors MN8, MN9, and MN10 off. However, when the device is powered down, MNVOFF turns off and MPVOFF is biased on which couples the high bus voltage on node S12 to node S10. Advantageously, the control circuitry of circuit 20 "steals" power from an I/O port to turn on transistors MN9 and MN10 that bias off transistors MN6 and MN7, respectively, to block potential leakage paths to ground. In addition, transistor MN8 is biased on to pull node S2 to ground, which keeps transistor MN1 biased off and the switch open.

Also, considering the case when the input leakage current is high when the bus voltage gets higher than Vcc due to leakage through transistors MN11 and MN12, these transistors are made weak to minimize the input leakage, but this causes a slow switching time because nodes S7 and S8 take a long time to discharge. In order to avoid this problem, a one-shot circuit is provided in the control circuitry 20 along with transistors MN13 and MN14. The one-shot will produce a high output for a short period of time when signal In2 transitions from a low level to a high level, or from a disable state to an enable state. This biases on transistors MN13 and MN14 for a short period to pull nodes S7 and S8 to ground quickly and allow the device to switch properly.

Voltage Reference Circuit

Figure 3:
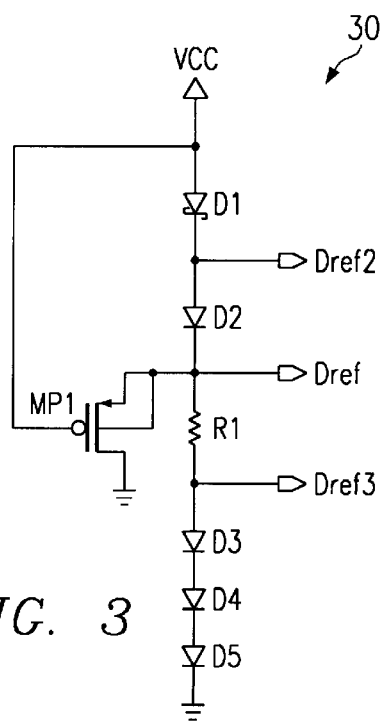
FIG. 3 is a schematic diagram of a power supply voltage reference circuit providing the reference control signals to the circuit of FIG. 2.
Figure 2A:
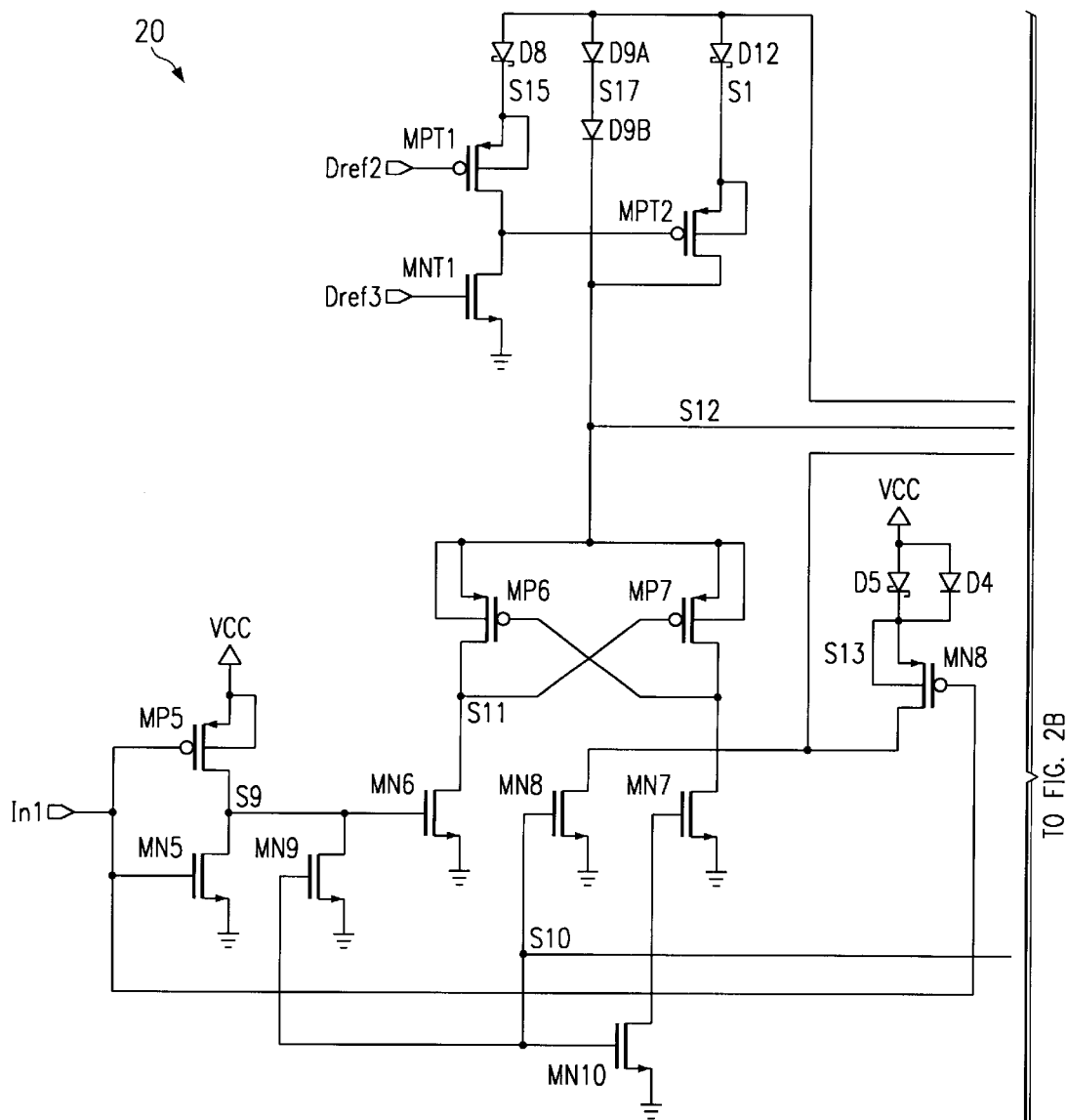
FIG. 2 is a schematic diagram of the present invention including a low voltage bus switch with known-state 5V tolerant circuit.
Figure 2B:
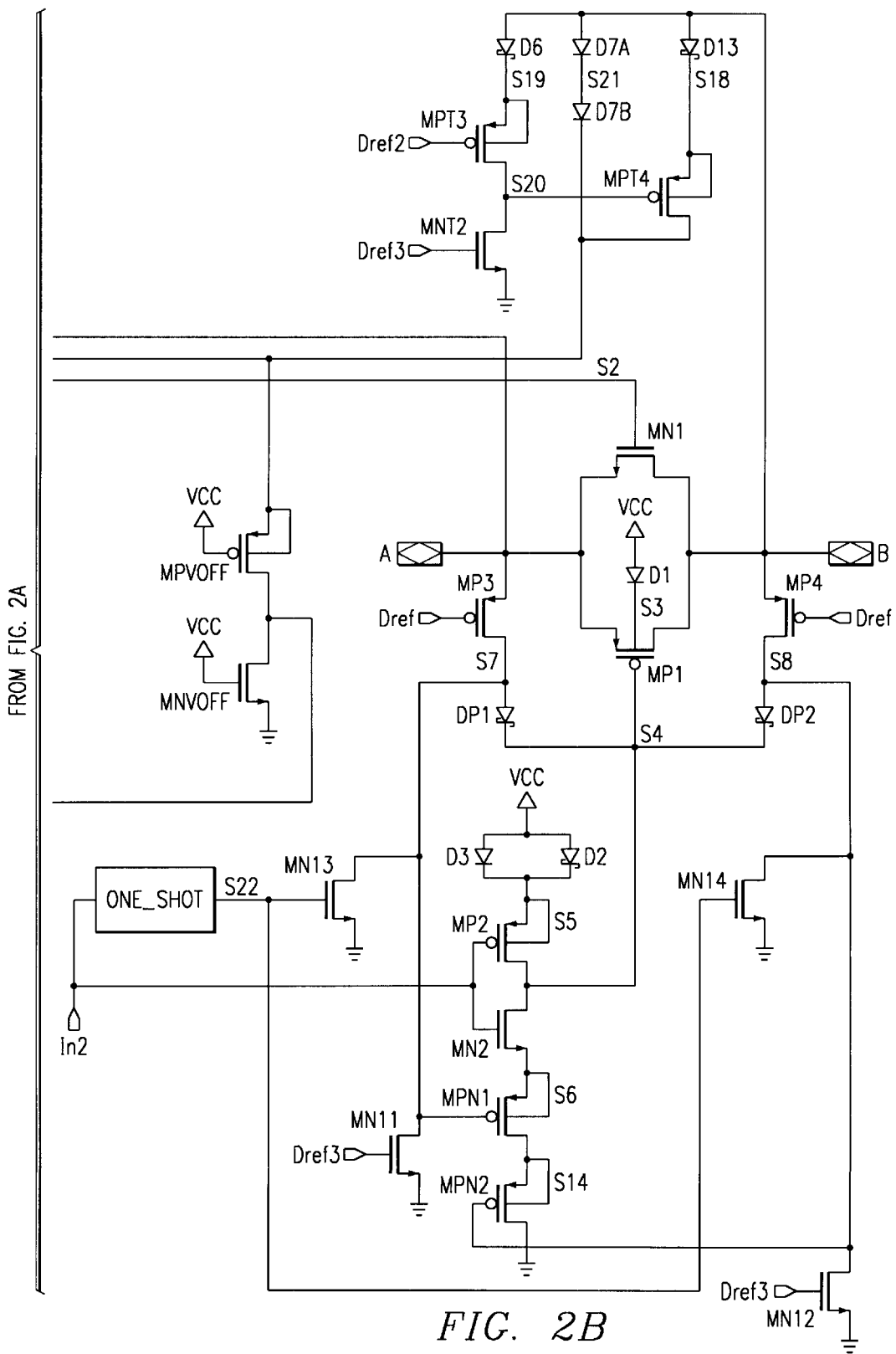

A voltage reference circuit 30 of the present invention used to provide the three Dref control signals (Dref, Dref2, and Dref3) for the crossbar switch of FIG. 2 is shown in FIG. 3. The Dref2 signal is equal to Vcc minus a Schottky diode forward drop of approximately 0.3V. The Dref signal is equal to Dref2 minus an additional PN diode forward drop, or about 1V below Vcc. The Dref3 signal is biased such that it provides a voltage level approximately equal to 1.5V when Vcc is 3.3V. A large resistor, R1, is included in the path between Vcc and ground to help reduce the DC power supply current drawn by this reference circuit. Another component that is incorporated in this circuit 30 is a P-channel transistor, MP1 , with its gate tied to Vcc. When the device is powered-up, transistor MP1 is biased off and there is no effect on the Dref signals. However, when the device is powered-down, transistor MP1 turns on and quickly pulls the Dref signal to ground. This is very important since blocking transistors MP3 and MP4 in FIG. 2 need to have their gates biased to ground as soon as possible during a power-down event. This ensures that the P-channel pass transistor will stay off during a power-sequencing event and the bus switch will keep the two buses isolated.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A crossbar switch circuit adapted to couple an electrical signal between a first port and a second port in a device, comprising:

a first switch coupled between the first port and the second port and having a control terminal adapted to receive a control signal to selectively electrically couple the first port to the second port; and a control circuit coupled to and providing the control signal to said first switch, said control circuit ensuring said control signal is limited to a first predetermined voltage when a voltage at the first port exceeds a second predetermined voltage, said second predetermined voltage being greater than said first predetermined voltage; and wherein said control circuit uses voltage from either the first port or the second port to prevent leakage paths to ground.

2. The crossbar switch circuit specified in claim 1 wherein said first switch is a CMOS type switch.

3. The crossbar switch circuit specified in claim 2 wheren said first switch is a crossbar switch.

4. The crossbar switch circuit specified in claim 1 wherein said first predetermined voltage is no more than about 3.6 volts.

5. The crossbar switch circuit specified in claim 4 wherein said second predetermined voltage exceeds 4.0 volts.

6. The crossbar switch circuit specified in claim 1 wherein said control circuit is adapted to maintain a third predetermined voltage at the second port when the voltage at the first port exceeds said second predetermined voltage.

7. The crossbar switch circuit specified in claim 6 wherein said third predetermined voltage is no greater than 3.6 volts.

8. The crossbar switch circuit specified in claim 7 wherein said second predetermined voltage is greater than 4 volts.

9. The crossbar switch circuit specified in claim 7 wherein said second predetermined voltage is greater than 5 volts.

10. The crossbar switch circuit specified in claim 1 wherein said control circuit maintains said first switch off when the device is powered down.

11. A crossbar switch circuit adapted to couple an electrical signal between a first port and a second port in a device, comprising;

a first switch coupled between the first port and the second port and having a control terminal adapted to receive a control signal to selectively electrically couple the first port to the second port; and a control circuit coupled to and providing the control signal to said first switch, said control circuit ensuring a voltage at the first port doesn't exceed a first predetermined voltage when a voltage at the second port exceeds a second predetermined voltage, said second predetermined voltage being greater than said first predetermined voltage, and said control circuit uses voltage from either the first port or the second port to prevent leakage paths to ground.

12. The crossbar switch circuit specified in claim 11 wherein said first predetermined voltage is no greater than 3.6 volts.

13. The crossbar switch circuit specified in claim 12 wherein said second predetermined voltage is no greater than 4 volts.

14. The crossbar switch circuit specified in claim 12 wherein said second predetermined voltage is no greater than 5 volts.

15. The crossbar switch circuit specified in claim 14 wherein said first switch is a CMOS crossbar switch.

16. The crossbar switch circuit specified in claim 15 wherein said control circuitry uses components other than a charge pump.

17. The crossbar switch circuit specified in claim 15 wherein said control circuitry uses components other than an oscillator.

18. The crossbar switch circuit specified in claim 11 wherein said control circuit maintains said first switch off when the device is powered down.

19. A method of operating a crossbar switch coupled between a first port and a second port, comprising the steps of:

providing a first voltage to the first port of the crossbar switch;

providing a second voltage to the second port of the crossbar switch; and limiting the first voltage at the first port to a first predetermined voltage when the second voltage at the second port exceeds a second predetermined voltage, and second predetermined voltage being greater than said first predetermined voltage; and using voltage from either the first or second port to prevent leakage paths to ground.

20. The method of operating a crossbar switch as specified in claim 19 wherein said first predetermined voltage is no more than 3.6 volts, said second predetermined voltage is at least 4.0 volts.

21. The method of operating a crossbar switch as specified in claim 19 wherein said first predetermined voltage is no more than 3.6 volts, said second predetermined voltage is at least 5.0 volts.

22. The method of operating a crossbar switch as specified in claim 19 further comprising the step that said crossbar switch is a CMOS switch and remains off during power down of a device incorporating the crossbar switch.

23. The method of operating a crossbar switch as specified in claim 19 further comprising the step of using control circuitry comprising components other than a charge pump or an oscillator.

* * * * *